United States Patent
Ko et al.

(10) Patent No.: US 8,569,837 B2
(45) Date of Patent: Oct. 29, 2013

(54) MOS DEVICES HAVING ELEVATED SOURCE/DRAIN REGIONS

(75) Inventors: Chih-Hsin Ko, Fongshan (TW); Hung-Wei Chen, Hsin-Chu (TW); Chung-Hu Ke, Taipei (TW); Ta-Ming Kuan, Zhongli (TW); Wen-Chin Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 807 days.

(21) Appl. No.: 11/800,615

(22) Filed: May 7, 2007

(65) Prior Publication Data

US 2008/0277735 A1 Nov. 13, 2008

(51) Int. Cl.
*H01L 29/417* (2006.01)
*H01L 27/092* (2006.01)
*H01L 29/78* (2006.01)

(52) U.S. Cl.
USPC ........... 257/369; 257/377; 257/382; 257/388; 257/E29.122; 257/E29.148; 438/581; 438/583; 438/300; 438/305

(58) Field of Classification Search
USPC ................ 257/369, 377, 382, 384, 388, 355, 257/408–412; 438/300–305
See application file for complete search history.

(56) References Cited

U.S. PATENT DOCUMENTS

| | | | |
|---|---|---|---|
| 4,998,150 A | 3/1991 | Rodder et al. | |
| 5,504,031 A | 4/1996 | Hsu et al. | |
| 5,834,343 A * | 11/1998 | Ogasawara et al. | 438/154 |
| 6,235,568 B1 | 5/2001 | Murthy et al. | |
| 6,479,358 B1 | 11/2002 | Yu | |
| 6,525,378 B1 | 2/2003 | Riccobene | |
| 6,562,686 B2 | 5/2003 | Lee | |
| 6,790,733 B1 | 9/2004 | Natzle et al. | |
| 7,037,818 B2 | 5/2006 | Dokumaci et al. | |
| 7,078,742 B2 | 7/2006 | Lin et al. | |
| 7,098,514 B2 | 8/2006 | Oh et al. | |
| 7,112,495 B2 | 9/2006 | Ko et al. | |
| 7,164,163 B2 | 1/2007 | Chen et al. | |
| 7,176,110 B2 | 2/2007 | Van Bentum et al. | |
| 7,348,248 B2 | 3/2008 | Cheng | |
| 7,358,551 B2 | 4/2008 | Chidambarrao et al. | |
| 7,361,563 B2 | 4/2008 | Shin et al. | |
| 7,718,500 B2 | 5/2010 | Chong et al. | |
| 2004/0262683 A1 | 12/2004 | Bohr et al. | |
| 2005/0112817 A1 | 5/2005 | Cheng et al. | |

(Continued)

FOREIGN PATENT DOCUMENTS

TW      I253716 B      4/2006

OTHER PUBLICATIONS

Hokazono, A., et al., "Source/Drain Engineering for Sub-100 nm CMOS Using Selective Epitaxial Growth Technique," International Electron Devices Meeting, Technical Digest, 2000, 4 pp.

(Continued)

*Primary Examiner* — Cathy N Lam
(74) *Attorney, Agent, or Firm* — Slater & Matsil, L.L.P.

(57) ABSTRACT

A semiconductor structure includes a semiconductor substrate; a gate dielectric over the semiconductor substrate; a gate electrode over the gate dielectric; a deep source/drain region adjacent the gate electrode; a silicide region over the deep source/drain region; and an elevated metallized source/drain region between the silicide region and the gate electrode. The elevated metallized source/drain region adjoins the silicide region.

18 Claims, 8 Drawing Sheets

(56) References Cited

U.S. PATENT DOCUMENTS

| | | |
|---|---|---|
| 2005/0170594 A1 | 8/2005 | Yeo et al. |
| 2005/0184345 A1 | 8/2005 | Lin et al. |
| 2006/0003533 A1 | 1/2006 | Kammler et al. |
| 2006/0088968 A1 | 4/2006 | Shin et al. |
| 2006/0131656 A1* | 6/2006 | Shin et al. .................... 257/369 |
| 2007/0020864 A1 | 1/2007 | Chong et al. |
| 2007/0138570 A1 | 6/2007 | Chong et al. |
| 2007/0170501 A1* | 7/2007 | Lee et al. .................... 257/344 |
| 2007/0194387 A1* | 8/2007 | Dyer et al. .................... 257/369 |
| 2008/0102573 A1 | 5/2008 | Liang et al. |
| 2009/0068810 A1* | 3/2009 | Tsai et al. .................... 438/300 |
| 2011/0127614 A1 | 6/2011 | Scheiper et al. |
| 2011/0298049 A1 | 12/2011 | Liang et al. |

OTHER PUBLICATIONS

Thompson, S. E., et al., "A 90-nm Logic Technology Featuring Strained-Silicon," IEEE Transactions on Electron Devices, Nov. 2004, vol. 51, No. 11, pp. 1790-1797.

Yasutake, N., et al., "A hp22 nm Node Low Operating Power (LOP) Technology with Sub-10 nm Gate Length Planar Bulk CMOS Devices," Symposium on VLSI Technology Digest of Technical Papers, IEEE, 2004, pp. 84-85.

Adey, J., et al., "Enhanced dopant solubility in strained silicon," Journal of Physics: Condensed Matter, vol. 16, 2004, pp. 9117-9126.

Wakabayashi, H., et al., "Improved Sub-10-nm CMOS Devices with Elevated Source/Drain Extensions by Tunneling Si-Selective-Epitaxial-Growth," International Electron Devices Meeting, IEEE, Dec. 2005, pp. 145-148.

* cited by examiner

MOS DEVICES HAVING ELEVATED SOURCE/DRAIN REGIONS

CROSS REFERENCES

This application relates to the following commonly assigned U.S. patent application Ser. No. 11/588,920, filed Oct. 27, 2006, entitled "CMOS Device with Raised Source and Drain Regions," which patent application is incorporated herein by reference.

TECHNICAL FIELD

This invention relates generally to semiconductor devices, and more particularly to metal-oxide-semiconductor (MOS) devices with raised source and drain regions.

BACKGROUND

With the scaling of integrated circuits, metal-oxide-semiconductor (MOS) devices become increasingly smaller. The junction depths of the MOS devices are reduced accordingly. This reduction causes technical difficulties during the formation processes. For example, small MOS devices demand high dopant concentrations in source and drain regions to reduce resistivity in the source and drain regions. Controlling implantation depth to form shallow junctions in source and drain extension regions of small-scale devices is also difficult. In addition, since the distance between source/drain silicide regions and the respective source/drain junctions is small, the leakage currents are high and drive currents are low.

To solve the above-discussed problems, raised source and drain regions have been formed. FIG. 1 illustrates a commonly formed MOS device having raised source/drain regions. In its formation, a gate stack includes gate dielectric 4 and gate electrode 6, and is formed on substrate 2. Lightly doped source/drain (LDD) regions 8 are formed by implantation. Gate spacers 10 are then formed. Then an epitaxial growth is performed to grow crystalline silicon layers 12 on substrate 2. Source and drain regions 14 are formed by an implantation, followed by the formation of source/drain silicide regions 16.

The conventional MOS devices as shown in FIG. 1 suffer drawbacks. Since PMOS and NMOS devices have different band-gaps, to reduce possible Schottky barrier heights between silicide regions 16 and the underlying semiconductor material, dual metal schemes are needed, in which the silicide regions of PMOS and NMOS devices comprise different metals. Accordingly, the silicide regions of PMOS and NMOS devices are formed separately, incurring high production cost.

Accordingly, what is needed in the art is a semiconductor device that incorporates raised source/drain regions thereof, to benefit from associated reduced leakage currents and increased drive currents while at the same time overcoming the deficiencies of the prior art.

SUMMARY OF THE INVENTION

In accordance with one aspect of the present invention, a semiconductor structure includes a semiconductor substrate; a gate dielectric over the semiconductor substrate; a gate electrode over the gate dielectric; a deep source/drain region adjacent the gate electrode; a silicide region over the deep source/drain region; and an elevated metallized source/drain region between the silicide region and the gate electrode. The elevated metallized source/drain region adjoins the silicide region.

In accordance with another aspect of the present invention, a semiconductor structure includes a semiconductor substrate; a gate dielectric over the semiconductor substrate; a gate electrode over the gate dielectric; a stressor in the semiconductor substrate and adjacent the gate electrode; and an elevated metallized source/drain region between the stressor and the gate electrode. The elevated metallized source/drain region has a bottom surface substantially higher than a top surface of the semiconductor substrate.

In accordance with yet another aspect of the present invention, a semiconductor structure includes a semiconductor substrate comprising an NMOS region and a PMOS region; an NMOS device in the NMOS region; and a PMOS device in the PMOS region. The NMOS device includes a first gate stack on the semiconductor substrate; a first spacer on a sidewall of the first gate stack; a first deep source/drain region adjacent the first gate stack; a first silicide region over the first deep source/drain region; and a first elevated metallized source/drain region between the first silicide region and the first gate stack. The PMOS device includes a second gate stack on the semiconductor substrate; a second spacer on a sidewall of the second gate stack; a second deep source/drain region adjacent the second gate stack; a second silicide region over the second deep source/drain region; and a second elevated metallized source/drain region between the second silicide region and the second gate stack.

In accordance with yet another aspect of the present invention, a method for forming a semiconductor structure includes providing a semiconductor substrate; forming a gate dielectric over the semiconductor substrate; forming a gate electrode over the gate dielectric; forming a gate spacer on sidewalls of the gate dielectric and the gate electrode; forming a deep source/drain region adjacent the gate electrode; forming a silicide region over the deep source/drain region; and forming an elevated metallized source/drain region between the silicide region and the gate electrode. The elevated metallized source/drain region adjoins the silicide region.

In accordance with yet another aspect of the present invention, a method for forming a semiconductor structure includes providing a semiconductor substrate; forming a gate dielectric over the semiconductor substrate; forming a gate electrode over the gate dielectric; forming a gate spacer on a sidewall of the gate dielectric and a sidewall of the gate electrode; forming an epitaxy region on a surface of the semiconductor substrate, wherein the epitaxy region has a sidewall adjoining a sidewall of the gate spacer; forming a main spacer on the sidewall of the gate spacer; forming a deep source/drain region having an inner edge substantially aligned to an outer edge of the main spacer; removing the main spacer; forming a metal layer on the epitaxy region and the deep source/drain region; and reacting the metal layer with the epitaxy region and the deep source/drain region to form a silicide region over the deep source/drain region, and an elevated metallized source/drain region between the silicide region and the gate electrode, respectively.

The advantageous features of the present invention include increased drive currents and reduced leakages currents of MOS devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming raised source and drain regions is provided. The intermediate stages of manufacturing embodiments of the present invention, which combines the formation of a PMOS device and an NMOS device, are illustrated. Throughout the various views and illustrative embodiments of the present invention, like reference numbers are used to designate like elements.

Figure 1:
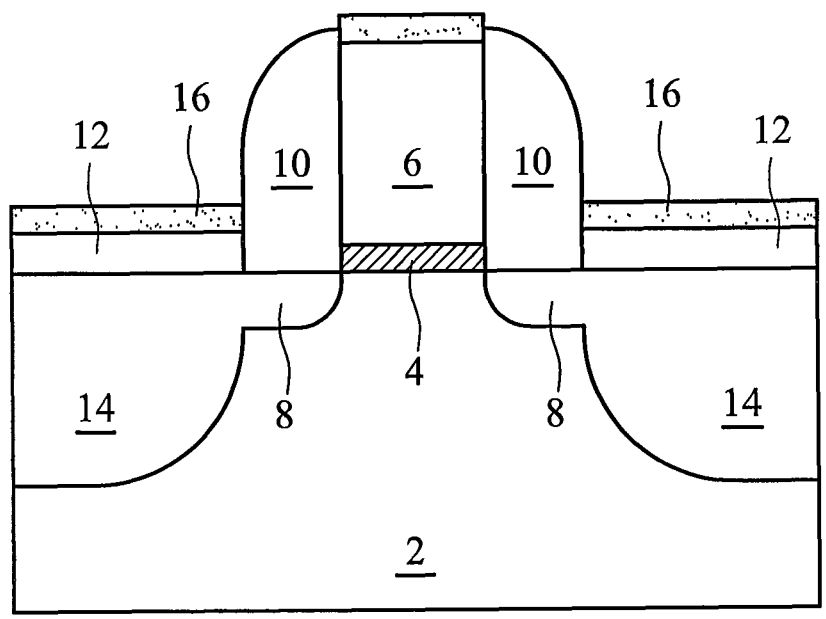
FIG. 1 illustrates a conventional metal-oxide-semiconductor (MOS) device having raised source and drain regions.
Figure 2:
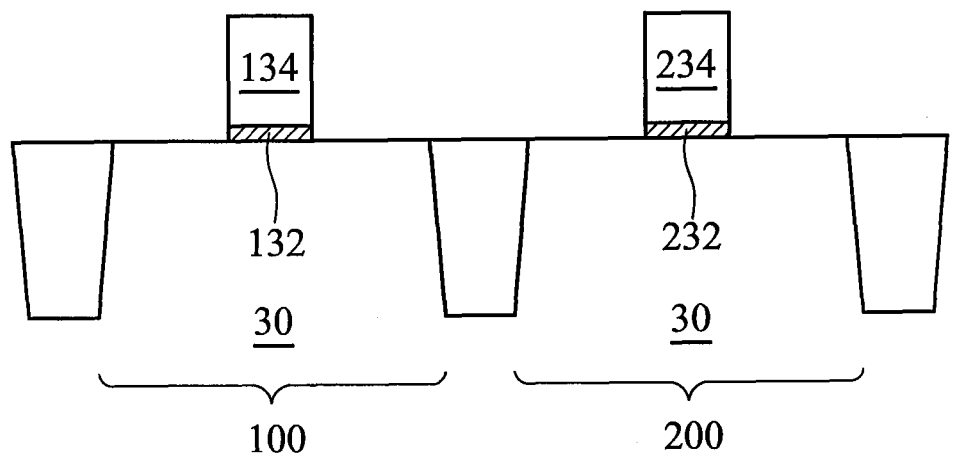
FIGS. 2 through 8 are cross-sectional views of intermediate stages in the manufacturing of a first embodiment of the present invention, wherein a PMOS device and an NMOS device are formed, both having raised source and drain regions.

Referring to FIG. 2, substrate 30, which includes NMOS region 100 and PMOS region 200, is provided. Substrate 30 may be formed of bulk silicon, although other commonly used structures and materials, such as silicon-on-insulator (SOI) structure and silicon alloys, can be used. Substrate 30 is preferably lightly doped.

A gate stack, including gate dielectric 132 and gate electrode 134, is formed in NMOS region 100. A gate stack, including gate dielectric 232 and gate electrode 234, is formed in PMOS region 200. Each of the gate stacks may further include a mask layer (not shown) on the respective gate electrodes 134 and 234, wherein the mask layer may be formed of silicon nitride. Gate dielectrics 132 and 232 preferably include commonly used dielectric materials such as oxides, nitrides, oxynitrides, carbides, and combinations thereof. Gate electrodes 134 and 234 may be formed of polysilicon. Alternatively, gate electrodes 134 and 234 are formed of other commonly used conductive materials such as metals, metal silicides, metal nitrides, and combinations thereof. As is known in the art, gate dielectrics 132 and 232 and gate electrodes 134 and 234 may be formed by stacking a gate electrode layer on a gate dielectric layer, and then patterning the stacked layers.

Figure 3:
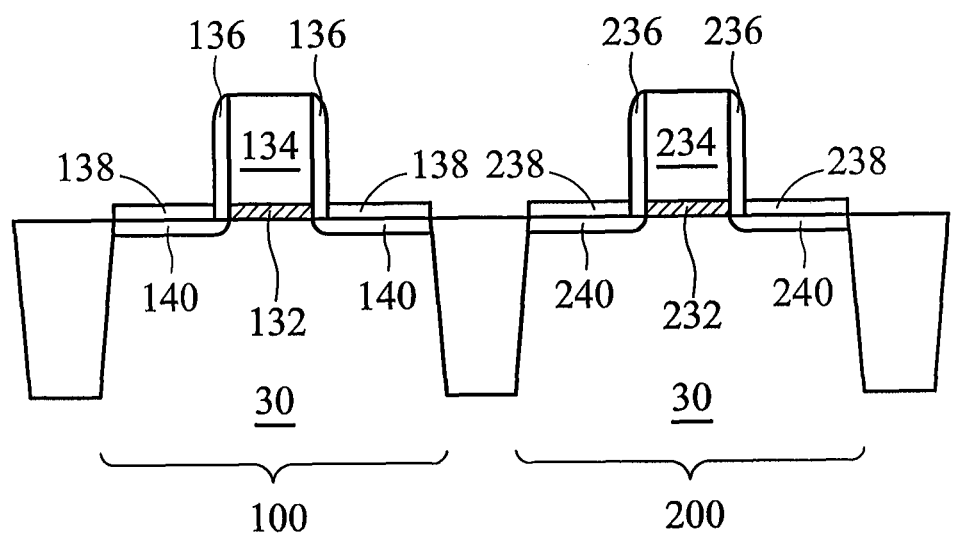

FIG. 3 illustrates the formation of gate spacers 136 and 236 and epitaxy regions 138 and 238. Preferably, gate spacers 136 and 236 are thin, with preferred thicknesses of less than about 150 Å, and more preferably between about 50 Å and about 150 Å. The preferred materials of spacers 136 and 236 include commonly used spacer materials, such as oxides, silicon nitrides, and combinations thereof. As is known in the art, the formation of gate spacers 136 and 236 may include forming a spacer layer, and then patterning the spacer layer to remove its horizontal portions. The deposition may be performed using commonly used techniques, such as plasma enhanced chemical vapor deposition (PECVD), low-pressure chemical vapor deposition (LPCVD), sub-atmospheric chemical vapor deposition (SACVD), and the like.

Epitaxy regions 138 and 238 are formed on exposed surfaces of substrate 30, for example, by selective epitaxial growth (SEG). Preferably, epitaxy regions 138 and 238 are formed of silicon, although other semiconductor materials can be used. In an exemplary embodiment, the thicknesses of epitaxy regions 138 and 238 is between about 100 Å and about 200 Å.

An implantation may be performed to form lightly doped source and drain (LDD) regions 140 and 240. Preferably, for forming lightly doped source/drain (LDD) regions 140, a photoresist (not shown) is formed to mask PMOS regions 200, and NMOS region 100 is implanted with n-type impurities, such as phosphorous, arsenic, and the like. Similarly, for forming LDD regions 240, a photoresist (not shown) is formed to mask NMOS regions 100, and PMOS region 200 is implanted with p-type impurities, such as boron, indium, and the like. Each of the LDD regions 140 and 240 preferably extends into substrate 30, and more preferably extends underlying spacers 136 and 236, although the impurities may be implanted substantially within epitaxy regions 138 and 238. Alternatively, LDD regions 140 and 240 may be formed by in-situ doping epitaxy regions 138 and 238 during their formation. However, in this case, LDD regions 140 and 240 may need to be grown separately due to their different conductivity types.

Figure 4:
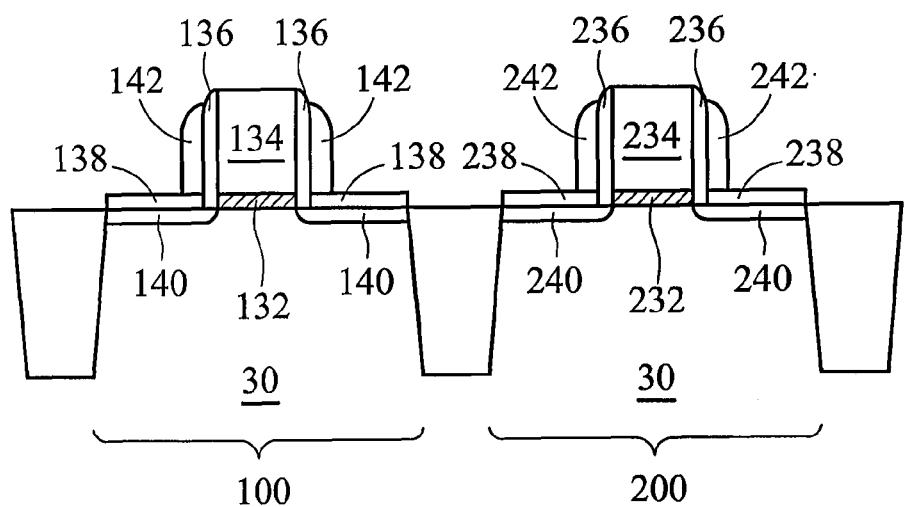

FIG. 4 illustrates the formation of main spacers 142 and 242, which are preferably formed by blanket depositing gate spacer layer(s), and then removing horizontal portions of the gate spacer layer(s). Main spacers 142 and 242 may be deposited using similar methods as forming gate spacers 136 and 236. In an embodiment, main spacers 142 and 242 include liner oxide portions and overlying nitride portions. In alternative embodiments, main spacers 142 and 242 include one or more layers, each comprising oxide, silicon nitride, silicon oxynitride (SiON) and/or other dielectric materials. In an exemplary embodiment, main spacers 142 and 242 have a thickness of between about 100 Å and about 1000 Å.

Figure 5:
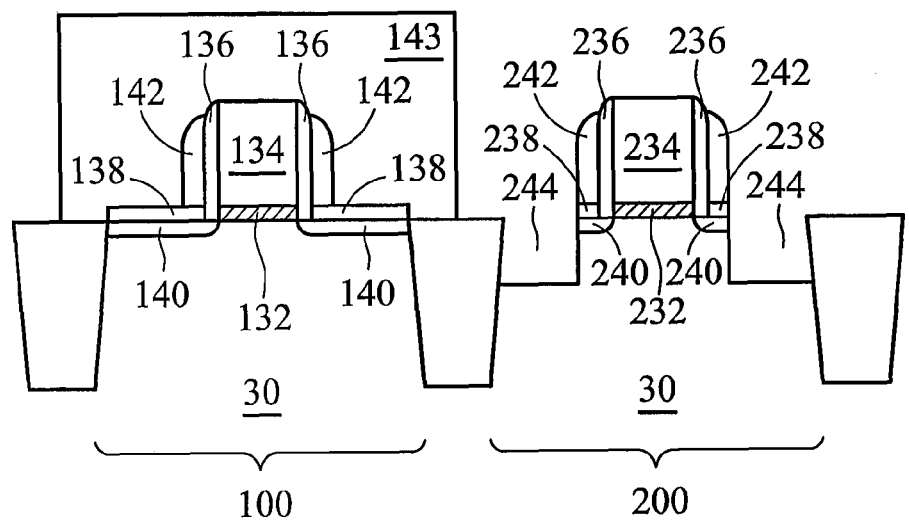

Referring to FIG. 5, photoresist 143 is formed to cover NMOS region 100. Recesses 244 are formed along the edges of main spacers 242, preferably by etching. In an exemplary embodiment formed using 90 nm technology, the preferred depth of recesses 244 is between about 500 Å and about 1000 Å, and more preferably between about 700 Å and 900 Å.

Figure 6:
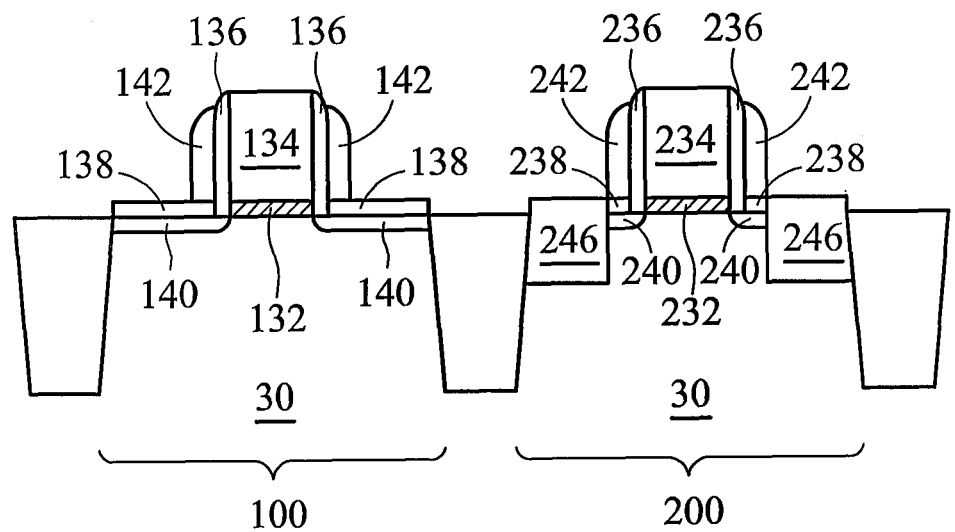

FIG. 6 illustrates the formation of silicon germanium (SiGe) stressors 246, for example, by SEG. In an exemplary embodiment, SiGe stressors 246 are formed using PECVD in a chamber. The precursors include Si-containing gases and Ge-containing gases, such as $SiH_4$ and $GeH_4$, respectively. In the preferred embodiment, p-type impurities, such as boron and/or indium, are in-situ doped during the epitaxial growth. Alternatively, no p-type impurity is doped during the epitaxial growth of SiGe stressors 246. Top surfaces of SiGe stressors 246 are preferably higher than a top surface of substrate 30.

Figure 7:
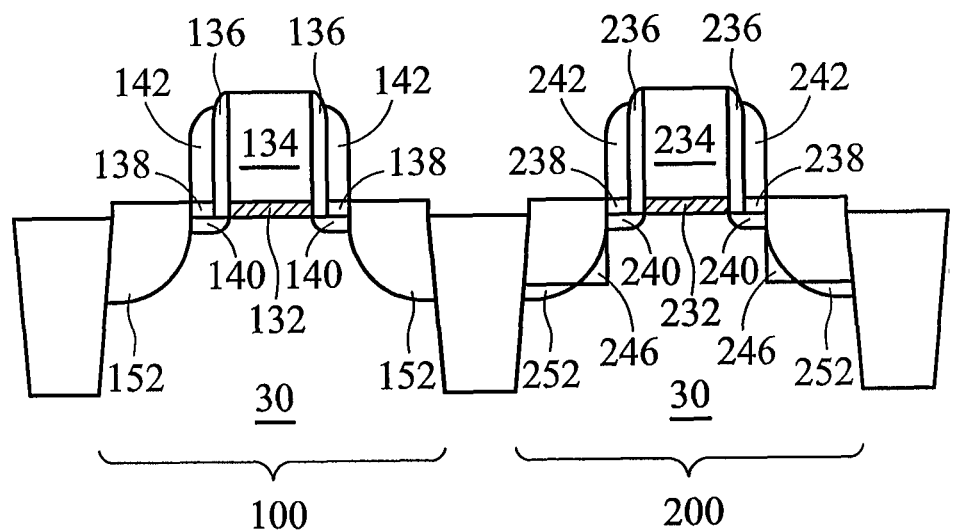

Deep implantations are then performed to form deep source and drain regions (hereinafter referred to as deep source/drain regions) 152 and 252, as is shown in FIG. 7. As is known in the art, to form deep source/drain regions, a photoresist (not shown) is formed to cover NMOS region 100. An implantation is then preformed to introduce p-type impurities to form deep source/drain regions 252. The photoresist is then removed. An additional photoresist (not shown) is formed to cover PMOS region 200, and an implantation is preformed to introduce n-type impurities to form deep source/drain regions 152. The additional photoresist is then removed.

Figure 8:
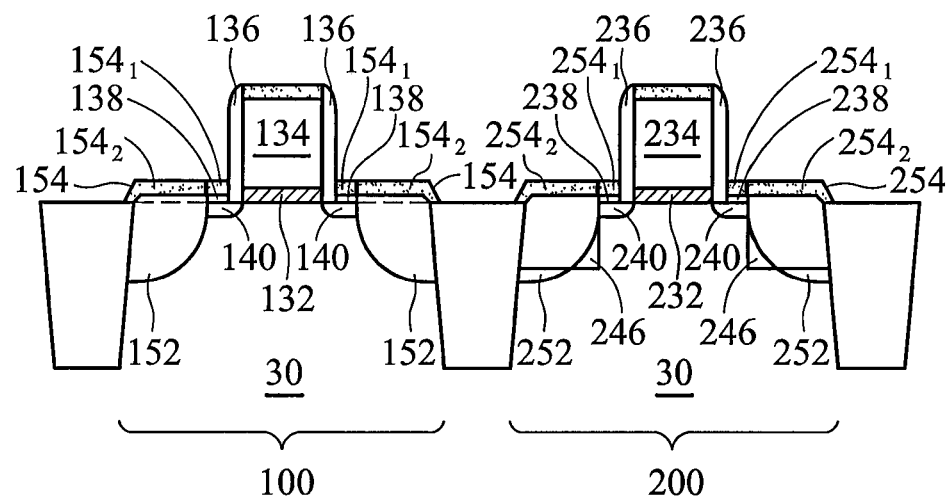

Referring to FIG. 8, main spacers 142 and 242 are removed. It is appreciated although in the embodiment as shown in FIG. 3, LDD regions 140 and 240 are formed before the formation of main spacers 142 and 242, LDD regions 140 and 240 may also be formed after the removal of main spacers 142 and 242, but before the formation of silicide regions. After the removal of main spacers 142 and 242, silicide regions 154 and 254 are formed. Throughout the description, germano-silicide regions 254 are also referred to as silicide regions 254. As is known in the art, silicide regions 154 and 254 are preferably formed by blanket depositing a thin layer of metal, such as nickel, cobalt, and combinations thereof. The substrate is then heated, which causes silicon and germanium to react with the metal where contacted. After the reaction, a layer of metal silicide is formed between silicon (or silicon germanium) and metal. The un-reacted metal is selectively removed through the use of an etchant that attacks metal but does not attack silicide and germano-silicide.

Silicide regions 154 each include two portions, portion $154_1$ directly over the respective LDD region 140, and portion $154_2$ on the respective deep source/drain region 152. Due to high concentrations in deep source/drain regions 152, the contacts between portions $154_2$ and the underlying deep source/drain regions 152 are Ohmic contacts. The contacts between portions $154_1$ and the underlying LDD regions 140 (or the remaining portion of epitaxy region 138) are likely to be Schottky contacts due to the low impurity concentration in LDD region 140 and epitaxy regions 138, although the contacts can also be Ohmic contacts. Similarly, the contacts between portions $254_2$ and the underlying deep source/drain regions 252 are Ohmic contacts. The contacts between portion $254_1$ and the underlying LDD regions 240 (or the remaining portion of epitaxy region 238) are likely to be Schottky contacts, although they can also be Ohmic contacts. Throughout the description, portions $154_1$ and $254_1$ of the respective silicide regions 154 and 254 are referred to as metallized source/drain regions, since portions $154_1$ and $154_2$ may be Schottky source/drain regions.

In an embodiment, the silicidation process only consumes top portions of epitaxy regions 138 and 238, and thus lower portions of epitaxy regions 138 and 238 remain after the silicidation process, as is shown in FIG. 8. Accordingly, the bottom surface of metallized source/drain regions $154_1$ and $254_1$ are higher than the bottom surfaces of gate dielectrics 132 and 232, respectively. In other embodiments, substantially all epitaxy regions are consumed. In yet other embodiments, the silicidation process causes the full consumption of epitaxy regions 238 and 238, and some of the underlying substrate 30. Accordingly, the bottom surface of metallized source/drain regions $154_1$ and $254_1$ are substantially level with, or even lower than, the bottom surfaces of gate dielectrics 132 and 232, respectively. In these embodiments, the metallized source/drain regions $154_1$ and $254_1$ are still elevated since they are higher than if formed directly on substrate 30.

Figure 9:
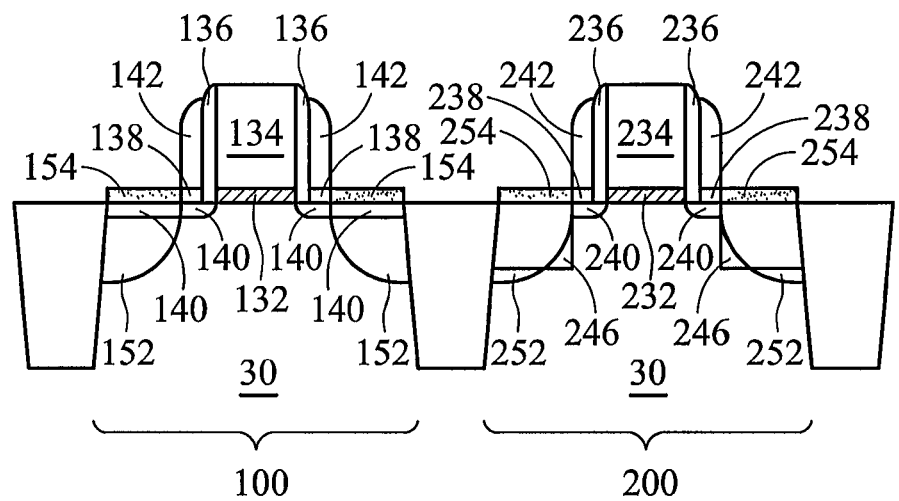
FIG. 9 illustrates a second embodiment of the present invention, wherein silicide regions are formed over deep source/drain regions only.

FIG. 9 illustrates another embodiment of the present invention. The initial steps are essentially the same as shown in FIGS. 2 through 7. After the formation of source/drain regions 152 and 252, main spacers 142 and 242 are not removed. Silicide regions 154 and 254 are then formed. Due to the masking of main spacers 142 and 242, silicide regions 154 and 254 are substantially limited over deep source/drain regions 152 and 252, respectively, but not over LDD regions 140 and 240.

Figure 10:
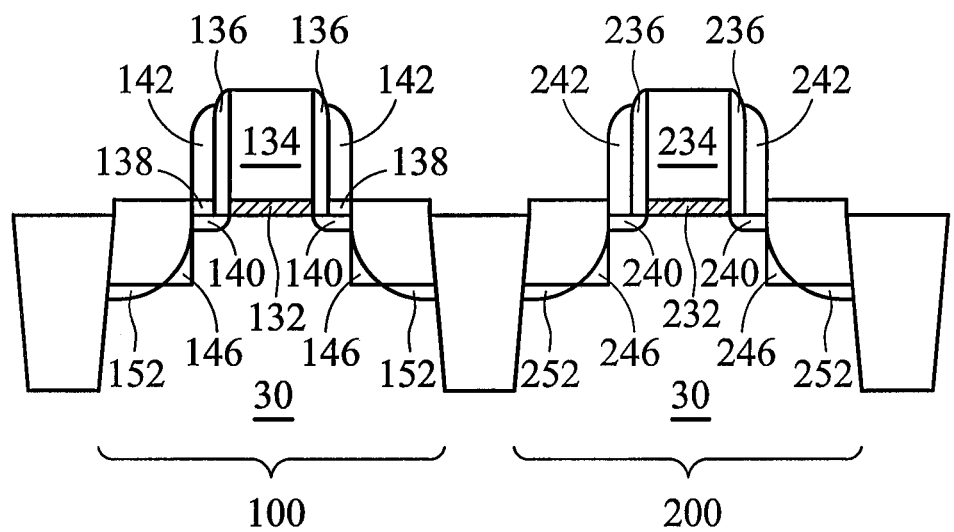
FIG. 10 illustrates a third embodiment of the present invention, wherein stressors are formed for both PMOS devices and NMOS devices.

As is known in the art, NMOS devices may also have stressors for applying tensile stresses. FIG. 10 illustrates a further embodiment, wherein stressors 146 are formed in NMOS region 100. Preferably, stressors 146 are formed of epitaxially grown carbon-doped silicon (SiC). The process steps for forming stressors 146 are essentially the same as for forming SiGe stressor 246, and thus are not repeated herein.

Figure 11:
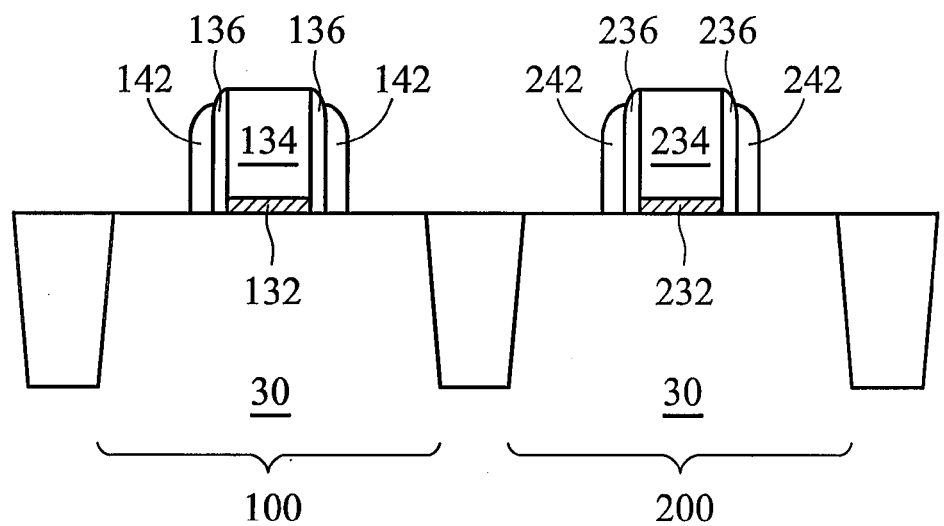
FIGS. 11 through 14 illustrate a fourth embodiment of the present invention, wherein stressors are formed before the formation of raised source and drain regions.

FIGS. 11 through 14 illustrate yet another embodiment. In the initial step of this embodiment, a structure as shown in FIG. 2 is provided. Next, as shown in FIG. 11, thin spacers 136 and 236 are formed, followed by the formation of main spacers 142 and 242 on the sidewalls of thin spacers 136 and 236, respectively.

Figure 12:
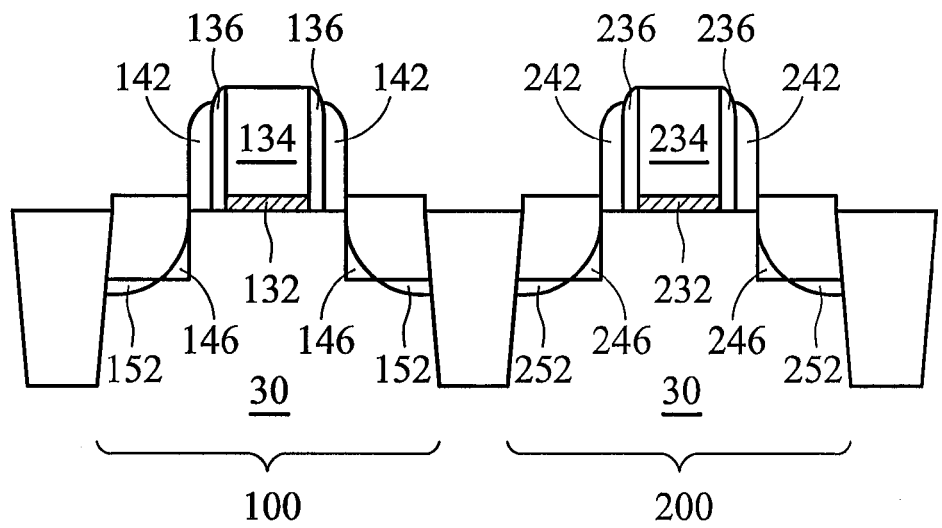

FIG. 12 illustrates the formation of stressors 146 and 246, and deep source/drain regions 152 and 252. SiGe stressors 246 are formed along sidewalls of main spacers 242, using essentially the same process steps as discussed in the preceding paragraphs. Similarly, SiC stressors 146 may be formed along sidewalls of main spacers 142. N-type and p-type impurities may be in-situ doped with the formation of SiC stressors 146 and SiGe stressors 246, respectively. Accordingly, SiC stressors 146 and SiGe stressors 246 form the source/drain region of the respective MOS devices. N-type and p-type impurities may be further implanted to increase impurity concentrations in source/drain regions 152 and 252. Main spacers 142 and 242 are then removed.

Figure 13:
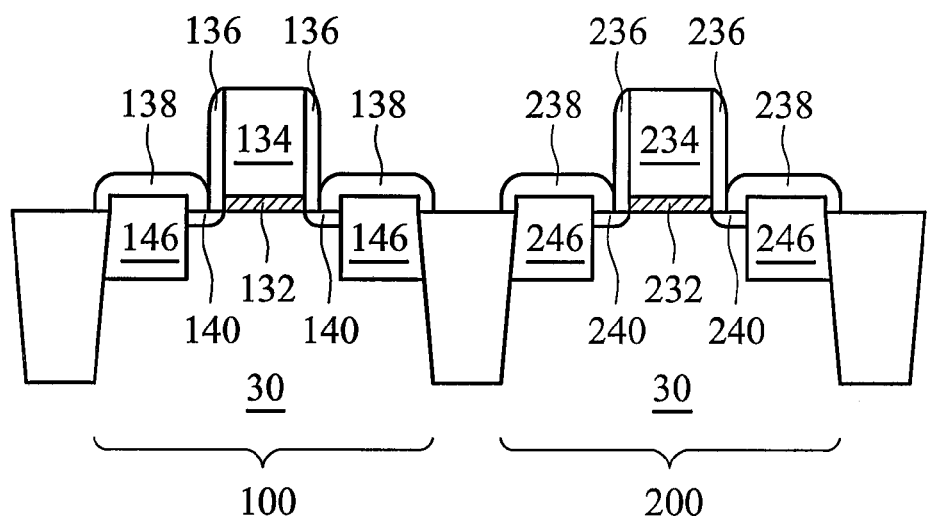

FIG. 13 illustrates the formation of epitaxy regions 138 and 238, which are preferably formed of silicon, and have essentially the same thicknesses as discussed in the preceding paragraphs. N-type and p-type impurities may then be implanted to form LDD regions 140 and 240. Preferably, LDD regions 140 and 240 extend slightly into substrate 30.

Figure 14:
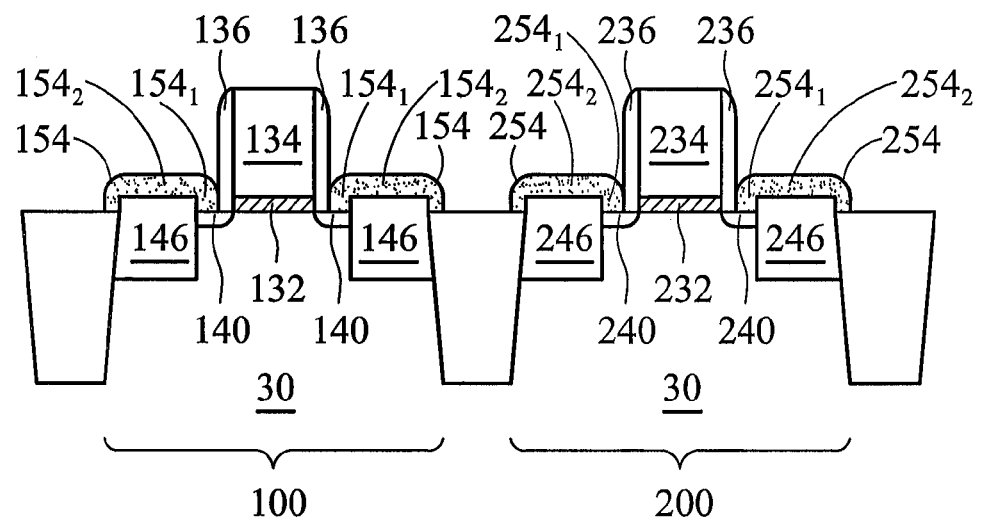

Next, as shown in FIG. 14, silicide regions 154 and 254 are formed. Similar to the embodiments discussed in the preceding paragraphs, silicide regions 154 and 254 may have bottom surfaces higher than, level with, or lower than the top surface of substrate 30. Silicide regions 154 include metallized source/drain regions $154_1$ directly over LDD regions 140, and portions $154_2$ directly over source/drain regions 152. Silicide regions 254 include metallized source/drain regions $254_1$ directly over LDD regions 240, and portions $254_2$ directly over source/drain regions 252.

The embodiments of the present invention have several advantageous features. First, the elevated metallized source/drain regions $154_1$ and $254_1$ help reduce the spreading of resistance. As a result, drive current is improved. Second, because silicide regions are raised, the junction leakage currents are accordingly reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
a semiconductor substrate;
a gate dielectric over the semiconductor substrate;
a gate electrode over the gate dielectric;
a deep source/drain region adjacent the gate electrode;
a silicide region directly on a surface of the deep source/drain region;
an elevated metallized source/drain region between the silicide region and the gate electrode, wherein the elevated metallized source/drain region adjoins the silicide region, wherein the silicide region has a different composition than the elevated metallized source/drain region; and
a lightly doped source/drain (LDD) region underlying the elevated metallized source/drain region.

2. The semiconductor structure of claim 1, wherein the elevated metallized source/drain region comprises same metals as the silicide region.

3. The semiconductor structure of claim 1, wherein the elevated metallized source/drain region has a Schottky contact with the LDD region.

4. The semiconductor structure of claim 3, wherein the LDD region comprises epitaxy silicon.

5. The semiconductor structure of claim 1, wherein the elevated metallized source/drain region is spaced apart from the gate dielectric and the gate electrode by a spacer, and wherein the spacer has a thickness of less than about 150 Å.

6. The semiconductor structure of claim 1, wherein the deep source/drain region comprises a stressor having an inner edge substantially vertically aligned to an interface between the silicide region and the elevated metallized source/drain region.

7. The semiconductor structure of claim 6, wherein the stressor comprises silicon germanium (SiGe).

8. The semiconductor structure of claim 6, wherein the stressor comprises carbon-doped silicon (SiC).

9. The semiconductor structure of claim 6, wherein the silicide region has a bottom surface higher than a bottom surface of the gate dielectric.

10. A semiconductor structure comprising:
a semiconductor substrate;
a gate dielectric over the semiconductor substrate;
a gate electrode over the gate dielectric;
a stressor in the semiconductor substrate and adjacent the gate electrode, an upper surface of the stressor being silicided;
an elevated metallized source/drain region between the upper surface of the stressor and the gate electrode, wherein the elevated metallized source/drain region has a bottom surface substantially higher than a top surface of the semiconductor substrate, the elevated metallized source/drain region and the upper surface of the stressor comprising different materials; and
a lightly doped source/drain (LDD) region underlying the elevated metallized source/drain region.

11. The semiconductor structure of claim 10, wherein elevated metallized source/drain region is continuously connected to a silicide region over the stressor.

12. The semiconductor structure of claim 11, wherein the silicide region comprises a material selected from the group consisting essentially of germanium and carbon, and wherein the elevated metallized source/drain region is substantially free from the material.

13. The semiconductor structure of claim 10 further comprising an epitaxy silicon layer between the semiconductor substrate and the elevated metallized source/drain region.

14. The semiconductor structure of claim 10 further comprising a spacer on sidewalls of the gate dielectric and the gate electrode, wherein the spacer horizontally adjoins the gate electrode and the elevated metallized source/drain region, and wherein the spacer has a thickness of less than about 150 Å.

15. A semiconductor structure comprising:
a semiconductor substrate comprising an NMOS region and a PMOS region;
an NMOS device in the NMOS region, the NMOS device comprising:
a first gate stack on the semiconductor substrate;
a first spacer on a sidewall of the first gate stack;
a first deep source/drain region adjacent the first gate stack;
a first silicide region directly on a surface of the first deep source/drain region;
a first elevated metallized source/drain region between the first silicide region and the first gate stack; and
a first lightly doped source/drain (LDD) region underlying the first elevated metallized source/drain region; and
a PMOS device in the PMOS region, the PMOS device comprising:
a second gate stack on the semiconductor substrate;
a second spacer on a sidewall of the second gate stack;
a second deep source/drain region adjacent the second gate stack;
a second silicide region directly on a surface of the second deep source/drain region;
a second elevated metallized source/drain region between the second silicide region and the second gate stack, the second elevated metallized source/drain region comprising at least one different element than the second silicide; and
a second lightly doped source/drain (LDD) region underlying the second elevated metallized source/drain region.

16. The semiconductor structure of claim 15, wherein the first and the second elevated metallized source/drain regions are silicide regions comprising same metals.

17. The semiconductor structure of claim 15, wherein the first deep source/drain region comprises carbon-doped silicon (SiC), and the second deep source/drain region comprises silicon germanium (SiGe).

18. The semiconductor structure of claim 15, wherein each of the first and the second spacers has a thickness of less than about 150 Å.

* * * * *